(12) United States Patent
Matsuzawa (10) Patent No.: US 7,733,694 B2
(45) Date of Patent: Jun. 8, 2010

(54) NONVOLATILE SEMICONDUCTOR MEMORY HAVING A FLOATING GATE ELECTRODE FORMED WITHIN A TRENCH

(75) Inventor: Kazuya Matsuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/464,068

(22) Filed: Aug. 11, 2006

(65) Prior Publication Data

US 2007/0132006 A1 Jun. 14, 2007

(30) Foreign Application Priority Data

Dec. 8, 2005 (JP) .............................. 2005-354676

(51) Int. Cl.
*G11C 11/34* (2006.01)
*G11C 16/04* (2006.01)
(52) U.S. Cl. .......................... 365/185.01; 365/185.05; 365/185.18
(58) Field of Classification Search ............ 365/185.17, 365/185.01, 185.05, 185.18
See application file for complete search history.

(56) References Cited

U.S. PATENT DOCUMENTS 5,576,567 A * 11/1996 Mori ........................ 257/316

| | | | | |
|---|---|---|---|---|
| 6,271,088 B1 * | 8/2001 | Liu et al. | ..................... | 438/259 |
| 6,317,360 B1 * | 11/2001 | Kanamori | ............... | 365/185.01 |
| 6,657,251 B1 * | 12/2003 | Meguro | ....................... | 257/316 |
| 6,724,025 B1 * | 4/2004 | Takashima et al. | ........... | 257/288 |
| 2005/0265076 A1 * | 12/2005 | Forbes | .................... | 365/185.17 |

FOREIGN PATENT DOCUMENTS

| JP | 2-10597 | 1/1990 |
|---|---|---|
| JP | 4-118973 | 4/1992 |

* cited by examiner

*Primary Examiner*—Hoai V Ho
*Assistant Examiner*—Kretelia Graham
(74) *Attorney, Agent, or Firm*—Oblon, Spivak, McClelland, Maier & Neustadt, L.L.P.

(57) ABSTRACT

According to an aspect of the invention, a nonvolatile semiconductor memory comprises: a semiconductor substrate; a trench formed in the semiconductor substrate; a first insulating film being formed on a wall surface of the trench; a floating gate electrode formed on the first insulating film inside the trench; a source region formed in the semiconductor substrate; a drain region formed in the semiconductor substrate; a channel region formed between the source region and the drain region in the semiconductor substrate, a second insulating film formed on a surface of the semiconductor substrate; and a control gate electrode formed on the channel region and a surface of the second insulating film. The channel region is adjacent to the trench. A storage state of the nonvolatile semiconductor memory is formed by injecting or drawing charge into or from the floating gate electrode when a tunnel current flows through the first insulating film.

11 Claims, 14 Drawing Sheets

FIG. 15

NONVOLATILE SEMICONDUCTOR MEMORY HAVING A FLOATING GATE ELECTRODE FORMED WITHIN A TRENCH

CROSS-REFERENCE TO RELATED APPLICATIONS

This application is based on and claims the benefit of priority from the prior Japanese Patent Application No. 2005-354676, filed on Dec. 8, 2005; the entire contents of which are incorporated herein by reference.

TECHNICAL FIELD

The present invention relates to an electrically rewritable nonvolatile semiconductor memory.

BACKGROUND

Electrically rewritable nonvolatile semiconductor memory (flash memories) are known in which a floating gate electrode and a control gate electrode are stacked on a semiconductor substrate and charge is exchanged between the floating gate electrode and the semiconductor substrate by the tunnel effect to cause writing or erasure (JP-A-2-10597).

Figure 15:
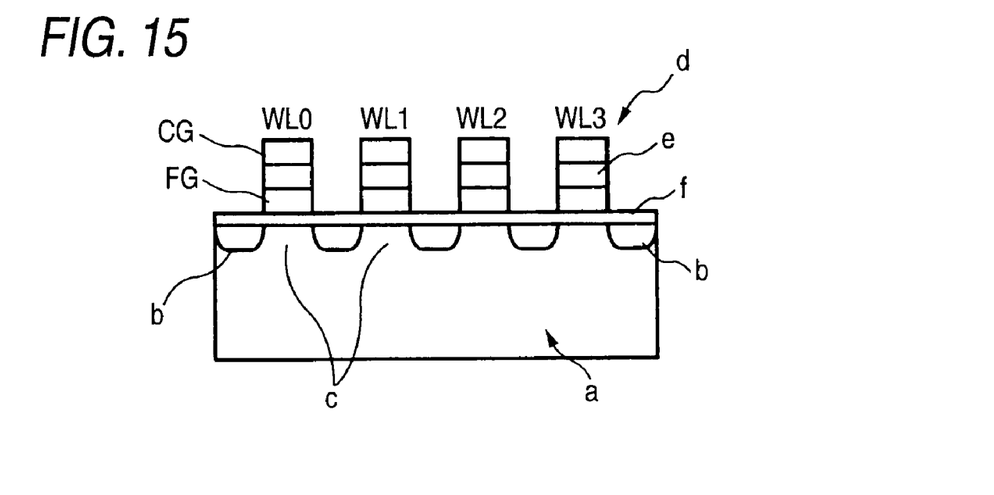
FIG. 15 is an explanatory diagram of a nonvolatile semiconductor memory according to a related art.

FIG. 15 is a schematic diagram of a NAND memory which is one type of electrically rewritable nonvolatile semiconductor memory. In the NAND memory, a laminated gate region d consisting of a floating gate electrode FG, an inter-gate insulating film e, and a control gate electrode CG is formed on the surface of a semiconductor substrate a via a tunnel insulating film f which is an insulating film through which tunnel current can flow. A channel region c is formed in a surface portion, located under the laminated gate region d, of the semiconductor substrate a. An impurity source/drain region (diffusion layer) b is formed in a surface portion, located between adjoining channel regions c, of the semiconductor substrate a. The laminated gate region d, the channel region c, and the source/drain regions b constitute a memory cell. Charge is written to the floating gate electrode FG from the semiconductor substrate a by utilizing the quantum mechanical tunnel effect. Information is read out by utilizing the fact that the amount of current flowing through the surface of the semiconductor substrate a depends on the presence/absence of charge in the floating gate electrode FG. Charge is erased by drawing the charge from the floating gate electrode FG into the semiconductor substrate a by utilizing the quantum mechanical tunnel effect. Symbols WL0-WL3 denote four word lines which are connected to the control gate electrodes CG of the memory cells, respectively.

The above nonvolatile semiconductor memory has the following problems. To produce a larger-capacity nonvolatile semiconductor memory, a larger number of memory cells forms in the same chip area by decreasing the length of the channel regions c and the interval between the channel regions c. However, as a result of such increase in the degree of miniaturization, the channel regions c may come too close to each other and adjoining channel regions c may interfere with each other through capacitive coupling, resulting in an erroneous operation. Further, if the interval between the channel regions c is too small, the laminated gate regions d may become too high relative to the interval between the channel regions c (see FIG. 15), in which case it is difficult to introduce a sufficient amount of impurity to the source/drain regions b. As a result, it is now becoming difficult to obtain a sufficiently large read current in the nonvolatile semiconductor memory.

SUMMARY

The present invention has been made in view of the above circumstances and provides a nonvolatile semiconductor memory.

According to an aspect of the invention, a high-density nonvolatile semiconductor memory is provided.

According to another aspect of the invention, a sufficient amount of impurity can be implanted into source/drain regions in the nonvolatile semiconductor memory.

According to still another aspect of the invention, a nonvolatile semiconductor memory comprises: a semiconductor substrate; a trench formed in the semiconductor substrate; a first insulating film being formed on a wall surface of the trench; a floating gate electrode formed on the first insulating film inside the trench; a source region formed in the semiconductor substrate; a drain region formed in the semiconductor substrate; a channel region formed between the source region and the drain region in the semiconductor substrate, a second insulating film formed on a surface of the semiconductor substrate; and a control gate electrode formed on the channel region and a surface of the second insulating film. The channel region is adjacent to the trench. A storage state of the nonvolatile semiconductor memory is formed by injecting or drawing charge into or from the floating gate electrode when a tunnel current flows through the first insulating film.

According to still yet another aspect of the invention, there is provided a manufacturing method of a nonvolatile semiconductor memory including: forming a trench in a semiconductor substrate; forming a first insulating film on a wall surface of the trench; forming a floating gate electrode on the first insulating films inside the trench; forming a second insulating film and a control gate electrode on the floating gate electrode of the semiconductor substrate; forming a source region and a drain region in the semiconductor substrate by using the second insulating film and the control gate electrode as a mask; and forming a memory cell comprising a pair of the source/drain electrodes, the floating gate electrode, and the control gate electrode.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Embodiments will be hereinafter described in detail with reference to the drawings.

Figure 1A:
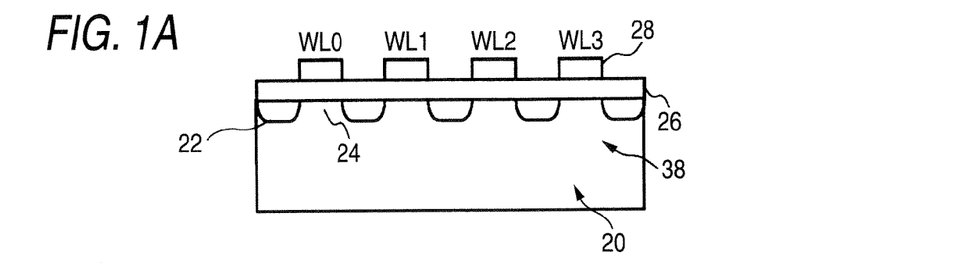
FIGS. 1A, 1B, 1C, and 1D are explanatory diagrams of a nonvolatile semiconductor memory according to a first embodiment.
Figure 1B:
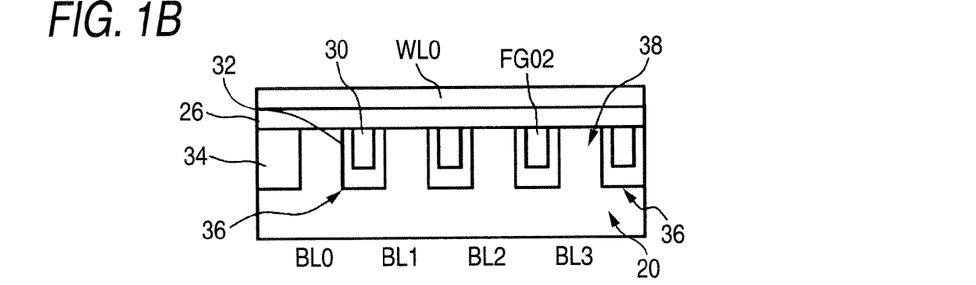
Figure 1C:
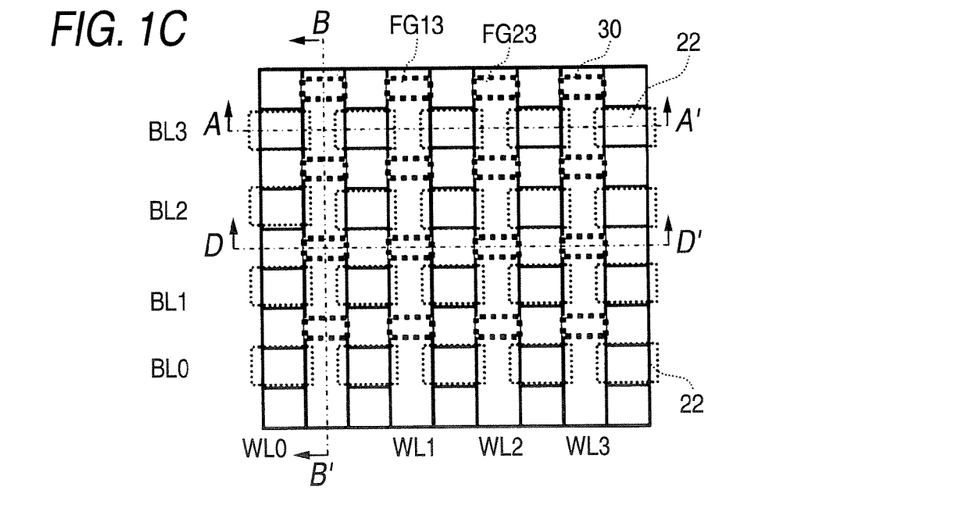
Figure 1D:
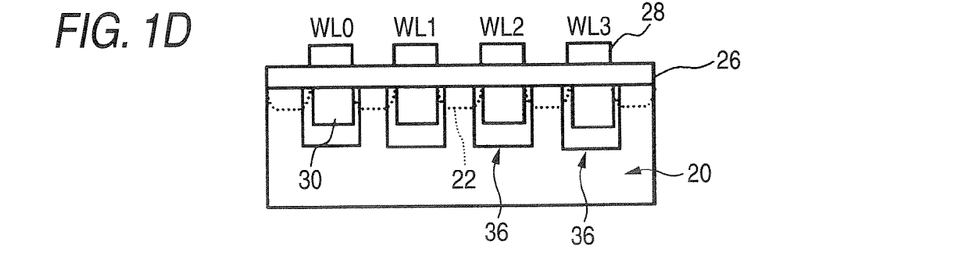

FIGS. 1A, 1B, 1C, and 1D show a nonvolatile semiconductor memory according to a first embodiment. FIGS. 1A, 1B, and 1D are sectional views taken along lines A-A', B-B', and D-D' in a top view of FIG. 1C. Two or more trenches 36 as device isolation regions are formed in a semiconductor substrate 20. Floating gate electrodes 30 are formed in the trenches 36 via first insulating films 32. Control gate electrodes 28 are formed on portions of the surface of the semiconductor substrate 20 and the surfaces of the things filling the trenches 36 with a second insulating film 26 interposed in between. Plural source/drain regions 22 are formed in the semiconductor substrate 20. The trenches 36 are grooves formed in the semiconductor substrate 20. The first insulating films 32 are formed on the wall surfaces of the trenches 36, and tunnel current can flow through the first insulating films 32. The floating gate electrodes 30 are formed in the trenches 36 with the first insulating films 32 interposed between themselves and the semiconductor substrate 20. Although the following description will be made with an assumption that the semiconductor substrate 20 and the source/drain regions 22 of the nonvolatile semiconductor memory are of a p type and an n type, respectively, The embodiments can also be applicable to the opposite case that the semiconductor substrate 20 and the source/drain regions 22 are of an n type and a p type, respectively, as well as a case that a semiconductor memory is formed in an island region formed in a semiconductor substrate. Although the NAND nonvolatile semiconductor memory will be described below as an example, the embodiments can also be applicable to nonvolatile semiconductor memories having various known structures as long as floating gate electrodes 30 can be formed in trenches 36 via first insulating films 32. Regions 34 are STI (shallow trench isolation) regions for isolating the semiconductor memory region by trenches.

As shown in FIG. 1A, the plural source/drain regions 22 are formed in surface portions of the semiconductor substrate 20. A channel region 24 is formed in a portion, between each pair of source/drain regions 22, of the semiconductor substrate 20. The control gate electrodes 28 are formed on the surface of the semiconductor substrate 20 via the second insulating film 26 and also formed on so as to cover the floating gate electrode 30 and the channel regions 24 via the second insulating film 26. Each memory cell 38 is formed by a pair of source/drain regions 22, a channel region 24, part of the second insulating film 26, part of a control gate electrode 28, a first gate insulating film 32, and a floating gate electrode 30, and serves as a transistor. Adjoining memory cells 38 share a source/drain region 22.

As shown in FIG. 1C, the memory cells 38 are arranged on the semiconductor substrate 20 in matrix form. In FIG. 1C, bit lines BL are row selection lines and word lines WL are column selection lines. For example, there are four bit lines BL0-BL3 (four rows) each of which consists of source/drain regions 22 and channel regions 24, and there are four word lines WL0-WL3 (four columns) each of which is connected to a control gate electrode 28. The memory cells 38 are arranged in NAND form. The floating gate electrodes 30 are disposed beside the bit lines BL so as to be arranged parallel with the latter. The floating gate electrodes 30 are arranged along the word lines WL. That is, the floating gate electrodes 30 are arranged in matrix form and are denoted by FG00, FG01, . . . , FG10, FG11, . . . , FG32, and FG33. Since as described above the trenches 36 are formed in the semiconductor substrate 20 and the floating gate electrodes 30 are formed in the respective trenches 36, a nonvolatile semiconductor memory can be provided in which large amounts of charge can be accumulated in the floating gate electrodes 30 and hence stable storage states can be maintained. Further, since the trenches 36 can reduce the degree of electric interference between the channel regions 24, the memory cell 38 can be arranged at a high density.

In FIG. 1, each floating gate electrode 30 is located at the center of the associated trench 36 and adjoining floating gate electrodes 30 are symmetrical with respect to the bit line BL that is located between them. However, the floating gate electrodes 30 may have an arbitrary structure as long as each floating gate electrode 30 can influence the gate current because at least one of its surfaces is adjacent to a channel region 24 and each floating gate electrode 30 can exchange tunnel current with the semiconductor substrate 20. For example, each floating gate electrode 30 may be located off the center of the associated trench 36 so as to be closer to one of the adjacent channel regions 24.

Figure 2:
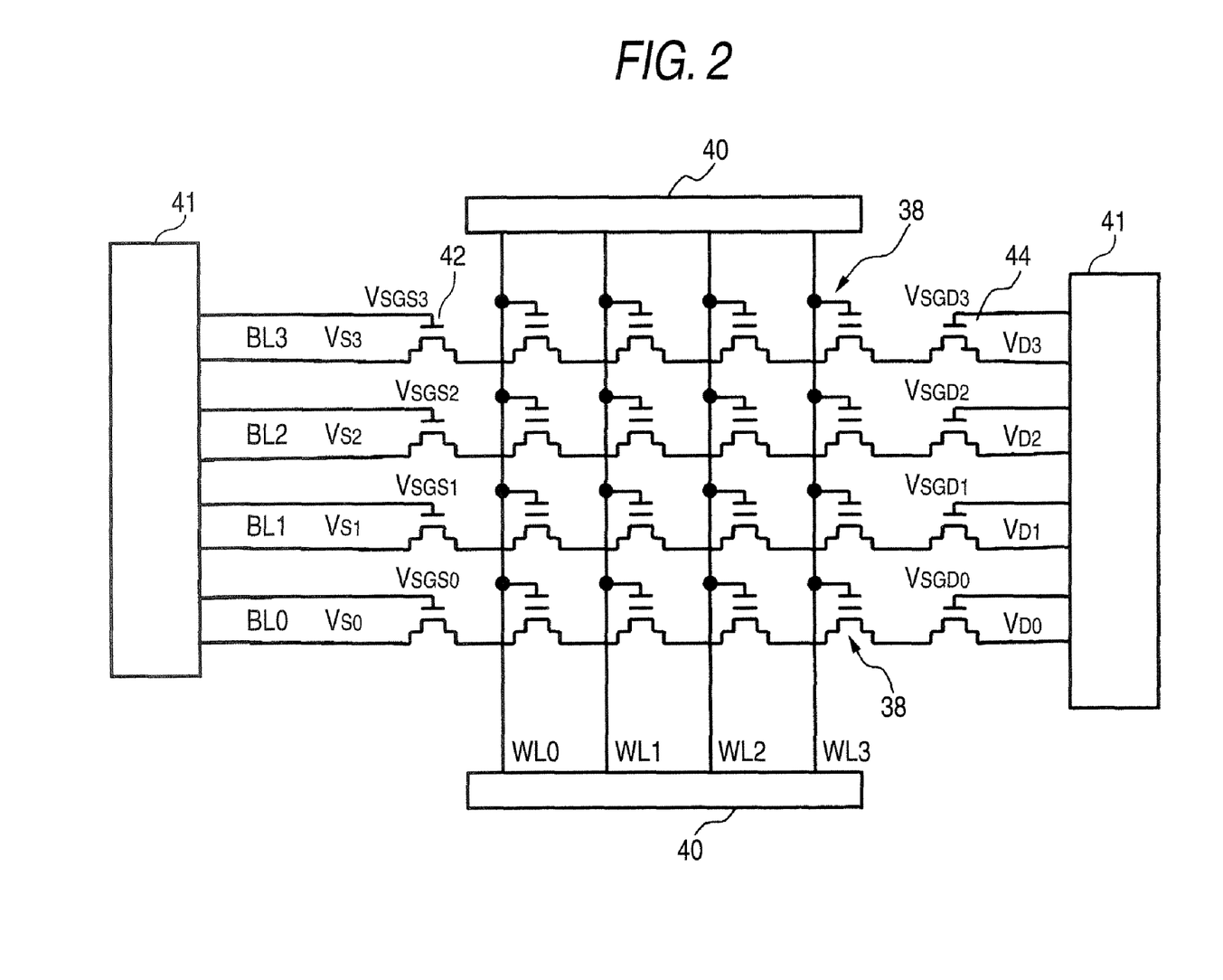
FIG. 2 is a circuit block diagram showing the nonvolatile semiconductor memory.

FIG. 2 is a circuit block diagram showing the nonvolatile semiconductor memory which is a 4×4 memory cell array. However, the embodiments are not limited to 4×4 nonvolatile semiconductor memories. The word lines WL0-WL3 are connected to selectors 40, whereby a write voltage $V_{PRG}$, a pass gate voltage $V_{PASS}$, a read voltage $V_{CGR}$, and other voltages (described later) are applied to the word lines WL0-WL3, that is, to the control gate electrodes 28 of the memory cells 38. The bit lines BL0-BL3 are connected to driving and detection circuits 41, whereby source voltages are applied to the bit lines BL0-BL3 via source-side selection gates 42 (SGS0-SGS3), that is, applied to the source-side source/drain electrodes 22 of the memory cells 38. And drain voltages are applied to the bit lines BL0-BL3 via drain-side selection gates 44 (SGD0-SGD3), that is, applied to the drain-side source/drain regions 22 of the memory cells 38. The driving and detection circuits 41 include circuits for writing to, erasing of, reading from, and other operations on the nonvolatile semiconductor memory (writing circuit, erasing circuit, reading circuit, etc.), and can apply voltages to, detect read currents from, and perform other operations on the bit lines BL.

(Writing to Memory Cells)

Figure 3A:
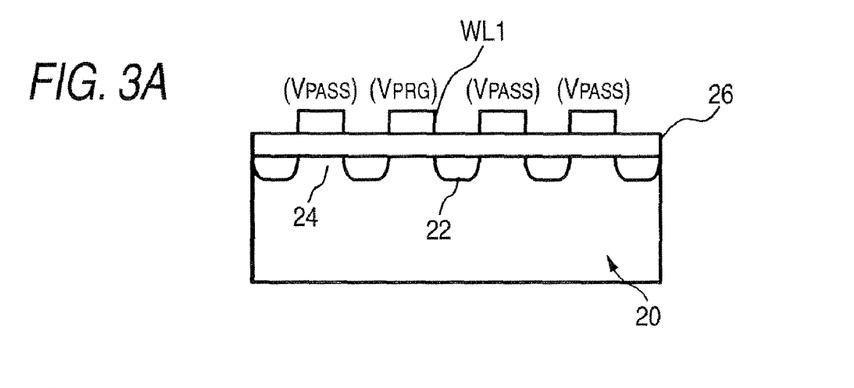
FIGS. 3A, 3B, and 3C are explanatory diagrams showing a writing operation on the nonvolatile semiconductor memory.
Figure 3B:
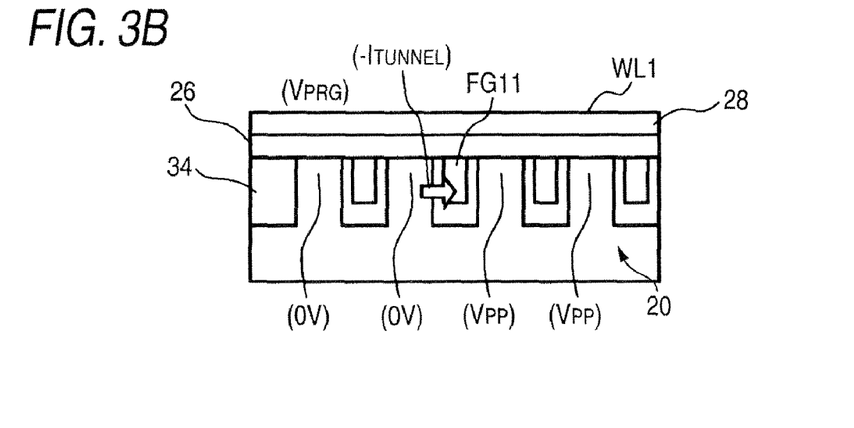
Figure 3C:
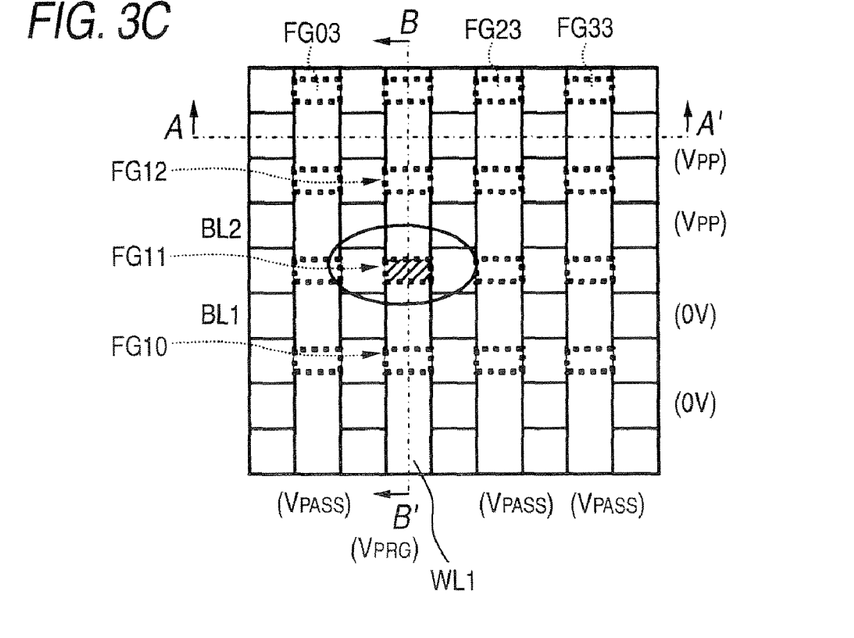

For example, writing to each memory cell 38 can be performed by the following method. Writing is performed by injecting electrons into the floating gate electrode 30 of a particular memory cell 38. FIG. 3 shows voltage conditions that are employed in writing to a particular floating gate electrode FG11. A write WL voltage $V_{PRG}$ is applied to the word line WL1. The write WL voltage $V_{PRG}$ is a relatively high voltage of 20 V, for example. A pass gate voltage $V_{PASS}$ for rendering the associated memory cells 38 (transistors) conductive is applied to the other word lines WL0, WL2, and WL3. At the same time, as shown in FIG. 3 (C), 0 V is applied to the bit lines BL0 and BL1 that are located on one side of the floating gate electrode FG11 and a write BL voltage $V_{pp}$ is applied to the bit lines BL2 and BL3 that are located on the other side of the floating gate electrode FG11.

As shown in FIG. 3B, the write WL voltage $V_{PRG}$ is applied to that portion of the control gate electrode 28 which is formed on the top surface of the floating electrode FG11. At the same time, as shown in FIG. 3C, 0 V is applied to the bit line BL that is located on the one side of the floating electrode FG11 and the write BL voltage $V_{pp}$ is applied to the bit line BL2 that is located on the other side of the floating gate electrode FG11. As a result, as indicated by a solid-white arrow in FIG. 3B, a negative tunnel current $I_{tunnel}$ flows from the channel region 24 of the bit line BL1 to the floating gate electrode FG11 and electrons are accumulated in the floating gate electrode FG11, that is, writing is performed. During that course, since the write WL voltage $V_{PRG}$ is applied to that portion of the control gate electrode 28 which is formed on the top surface of the floating electrode FG11, a positive voltage is induced in the floating electrode FG11. At the same time, the write WL voltage $V_{PRG}$ is applied between the two side surfaces of the floating electrode FG11. Therefore, the negative tunnel current $I_{tunnel}$ flows from the bit line BL1 to the floating gate electrode FG11 through the first insulating film 32. However, no tunnel current flows from the floating gate electrode FG11 to the channel region 24 of the bit line BL2. Writing is not performed on the floating gate electrodes FG10, FG12, and FG13 of the other memory cells 38 that are selected by the word line WL1, because the voltages applied to the bit lines BL that are located on both sides of each of the floating gate electrodes FG10, FG12, and FG13 are different from those applied to the bit lines BL1 and BL2 located on both sides of the floating gate electrode FG11.

Figure 4:
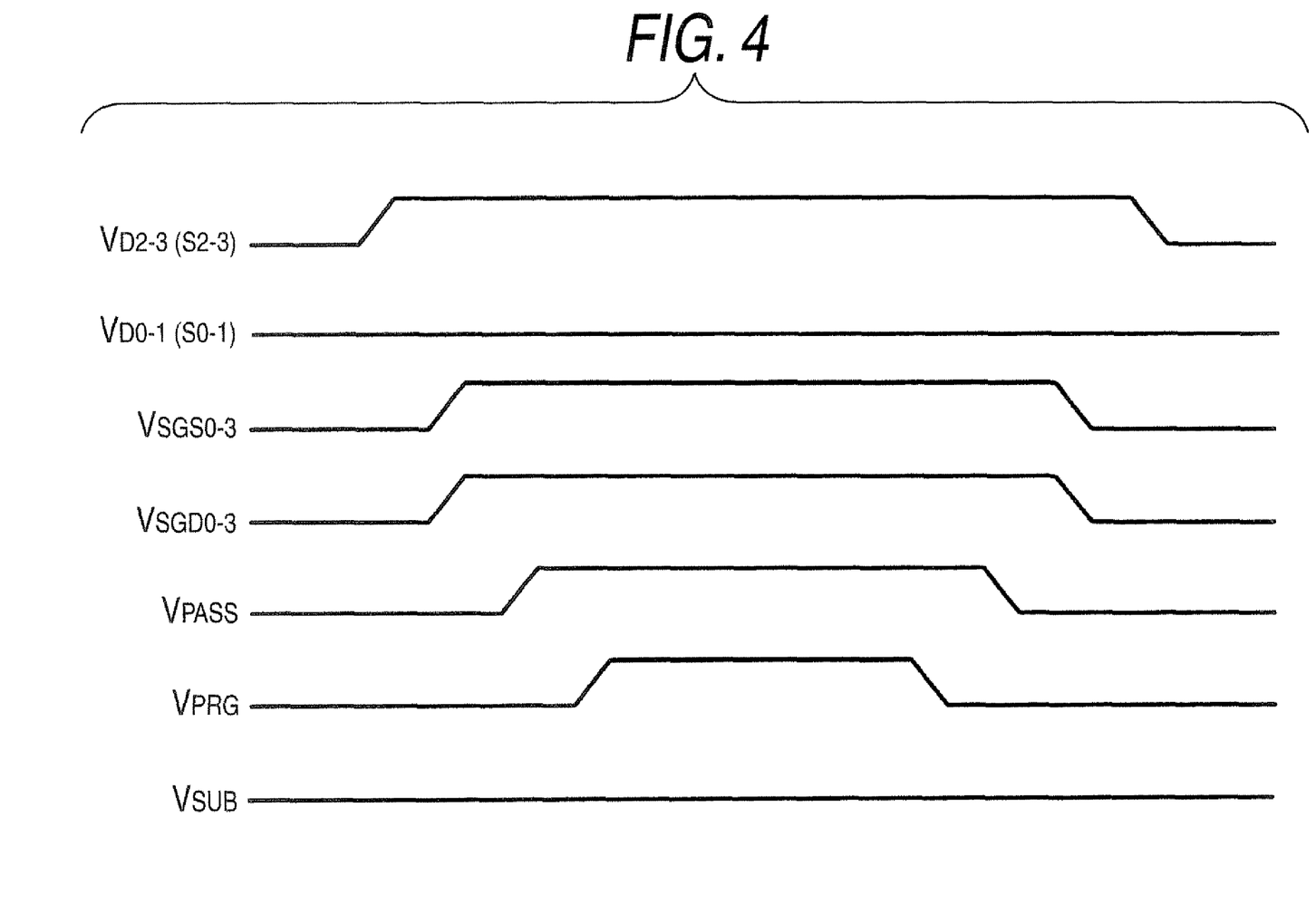
FIG. 4 is an explanatory diagram showing a voltage application sequence that is employed in writing.

FIG. 4 is a voltage application sequence that is employed in writing to the floating gate electrode FG11. First, source voltages and drain voltages are applied to the source-side selection gates SGS0-SGS3 and the drain-side selection gates SGD0-SGD3 which are connected to the bit lines BL. More specifically, as shown in FIGS. 2-4, source voltages $V_{S0}=V_{S1}=0$ V and $V_{S2}=V_{S3}=V_{PP}$ are applied to the respective source-side selection gates SGS0-SGS3 and drain voltages $V_{D0}=V_{D1}=0$ V and $V_{D2}=V_{D3}=V_{PP}$ are applied to the respective drain-side selection gates SGD0-SGD3. Then, the source-side selection gates SGS0-SGS3 and the drain-side selection gates SGD0-SGD3 are rendered conductive, whereby 0 V is applied to the bit lines BL0 and BL1 and the write BL voltage $V_{PP}$ is applied to the bit lines BL2 and BL3. Then, a voltage $V_{PRG}$ is applied to the word line WL1 so that the write WL voltage $V_{PRG}$ is applied to the control gate electrode 28 of the floating gate electrode FG11. The pass gate voltage $V_{PASS}$ is applied to the other word lines WL0, WL2, and WL3 so that the associated transistors connected to the bit lines BL are rendered conductive. A substrate voltage $V_{SUB}$ being 0 V is applied to the semiconductor substrate 20. The voltage $V_{PRG}$ is kept applied to the word line WL1 during such a long period (e.g., 100 μsec) that a sufficient amount of charge is written to the floating gate electrode FG11. The voltages $V_{PP}$ and $V_{PASS}$ are 10 V, for example.

Figure 5:
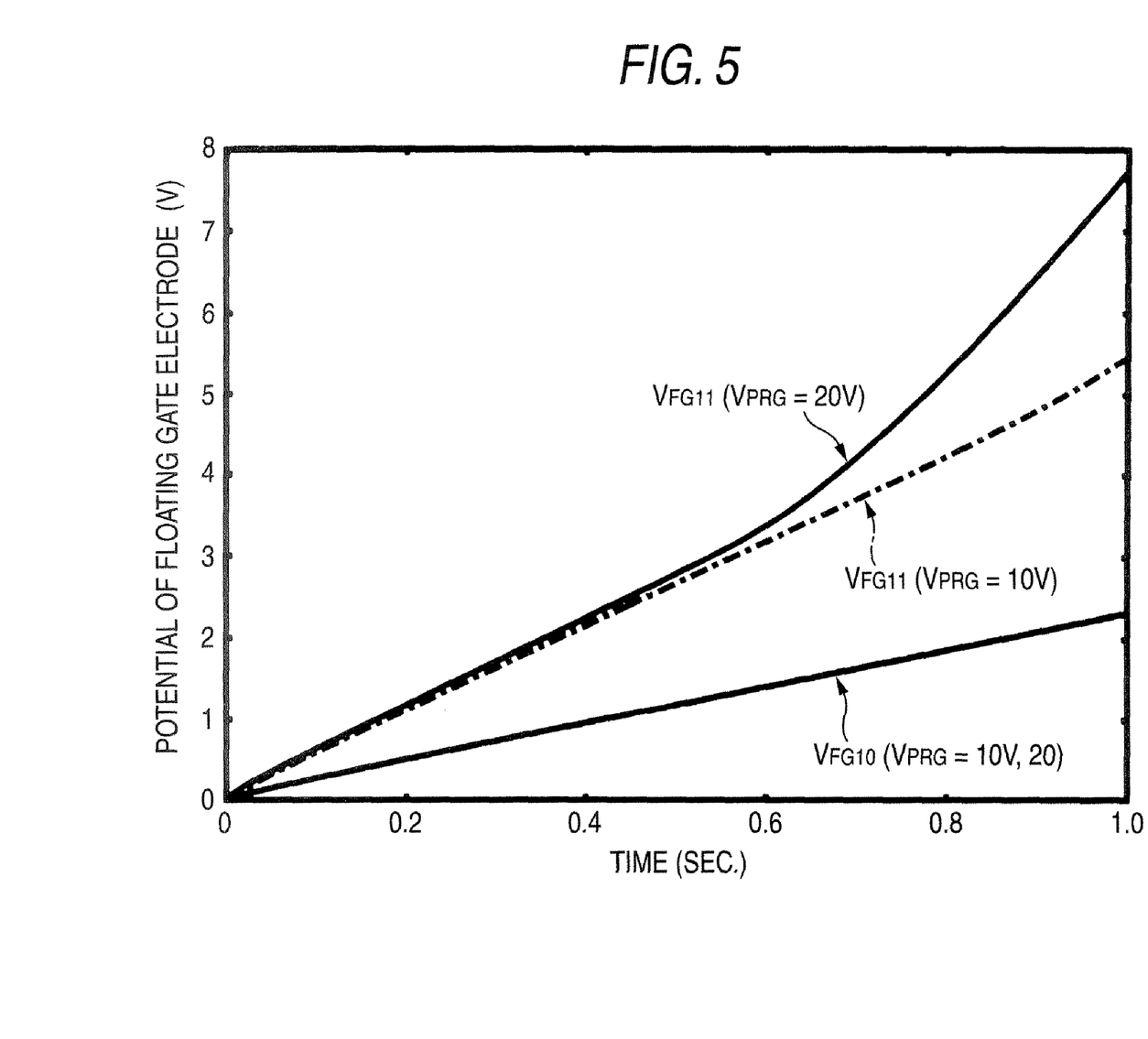
FIG. 5 is a graph showing a simulation result of writing to the nonvolatile semiconductor memory according to the first embodiment.

FIG. 5 shows a writing simulation result. The vertical axis shows the potential (V) of the floating gate electrode 30 concerned and the horizontal axis represents the time (sec) during which the voltage $V_{PRG}$ is applied to the control gate electrode 28. Two kinds of voltages $V_{PRG}$, 20 V and 10 V, were applied to the word line WL1. The other conditions were set the same as shown in FIG. 4. The potentials of the floating gate electrodes FG11 and FG10 were measured. Results are as follows. The curve of the case that $V_{PRG}=20$ V (solid line) is different from the curve of the case that $V_{PRG}=10$ V (chain line) in that the potential of the floating gate electrode FG11 starts to increase more steeply about 0.6 second after the application of $V_{PRG}$. This indicates that the potential occurring at the floating gate electrode 30 depends on the voltage applied to the control gate electrode 28. In contrast, the potential of the floating gate electrode FG10 increases at a lower rate than that of the floating gate electrode FG11. In addition, even after a lapse of 0.6 sec from the application of $V_{PRG}$, there occurs no difference between the curve of the case that $V_{PRG}=20$ V (solid line) and the curve of the case that $V_{PRG}=10$ V (chain line), that is, the solid-line curve and the chain-line curve coincide with each other. This indicates that a memory cell 38 to which information is to be written can be selected by controlling the potential of the associated floating gate electrode 30 by selecting the associated word line WL and bit lines BL.

(Erasing of Memory Cells)

Figure 6A:
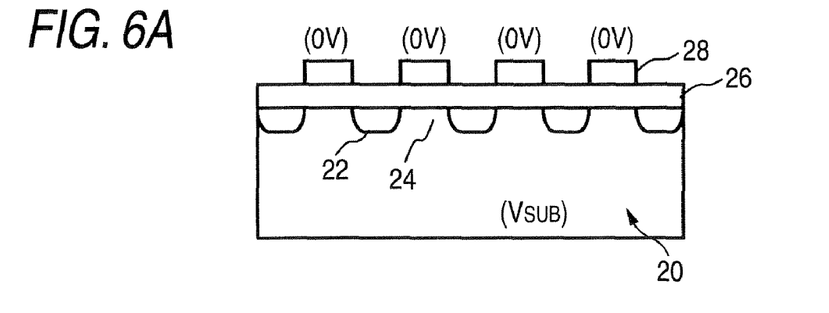
FIGS. 6A, 6B, and 6C are explanatory diagrams showing an erasing operation on the nonvolatile semiconductor memory.
Figure 6B:
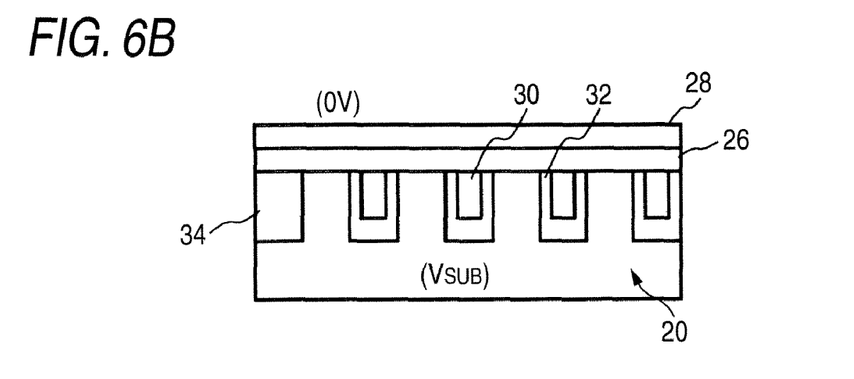
Figure 6C:
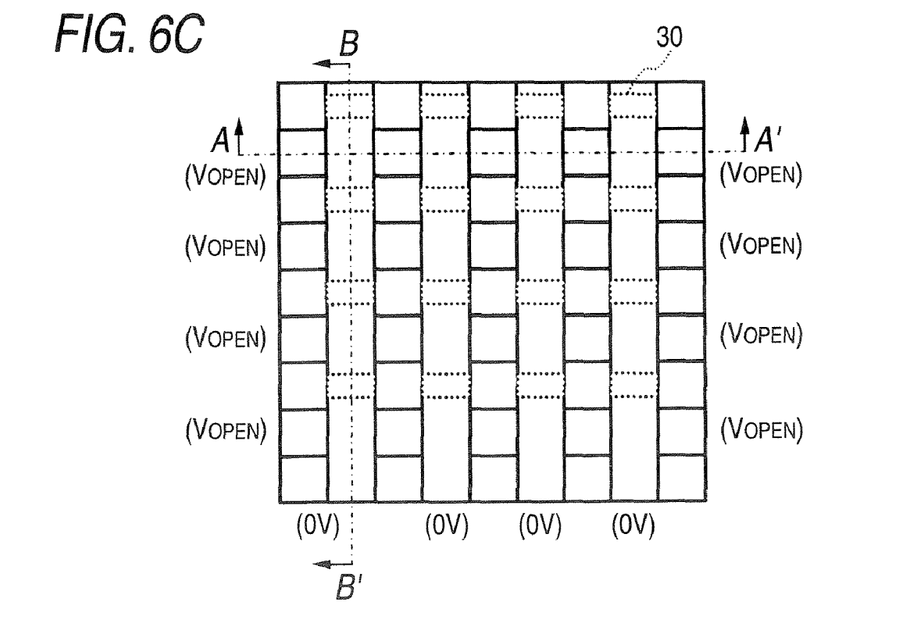
Figure 7:
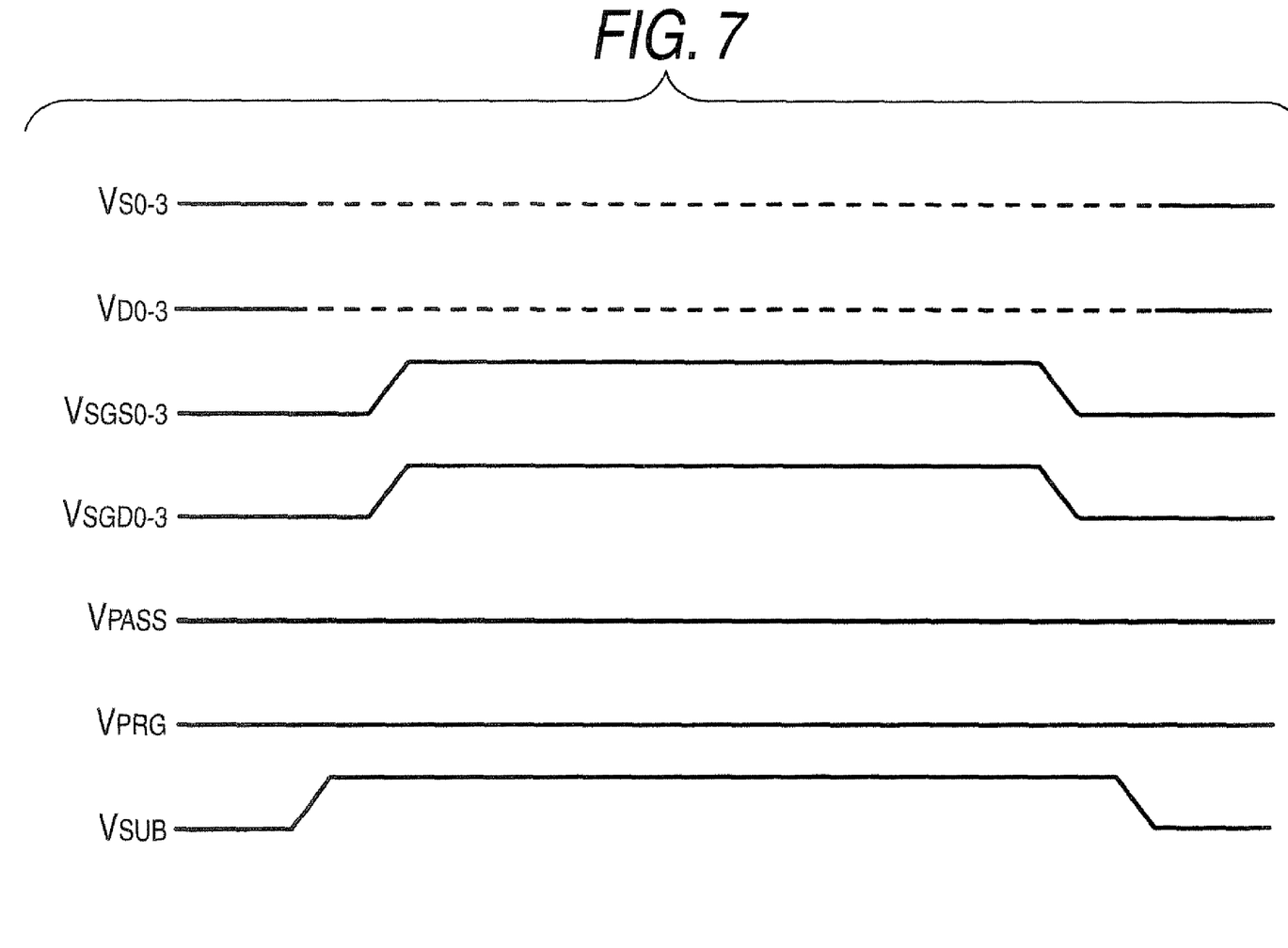
FIG. 7 is an explanatory diagram showing a voltage application sequence that is employed in erasure.

FIG. 6 shows voltage conditions that are employed in erasing the information from all the memory cells collectively. The source/drain regions of all the bit lines BL0-BL3 are rendered open (voltage: $V_{OPEN}$). All the word lines WL0-WL3 are grounded, that is, the control gate electrodes 28 of all the memory cells 38 are grounded. A positive voltage $V_{SUB}$ (e.g., 20 V) is applied to the semiconductor substrate 20. As a result, electrons that have been accumulated in all the floating gate electrodes 30 are drawn from those into the semiconductor substrate 20. FIG. 7 is a voltage application sequence that is employed in erasing the information from all the memory cells collectively. First, source voltages $V_{S0}$-$V_{S3}$ and drain voltages $V_{D0}$-$V_{D3}$ to be applied to the source-side selection gates SGS0-SGS3 and the drain-side selection gates SGD0-SGD3 which are connected to the bit lines BL are made open-circuit voltages ($V_{OPEN}$). Then, voltages $V_{SGS0}$-$V_{SGS3}$ are applied to the source-side selection gates SGS0-SGS3 and voltages $V_{SGD0}$-$V_{SGD3}$ are applied to the drain-side selection gates SGD0-SGD3. All the word lines WL0-WL3 are given 0 V and the semiconductor substrate 20 is given a positive voltage $V_{SUB}$. As a result, electrons that have been accumulated in all the floating gate electrodes 30 are removed from those into the semiconductor substrate 20 as tunnel currents (negative currents).

(Reading from Memory Cell)

Figure 8A:
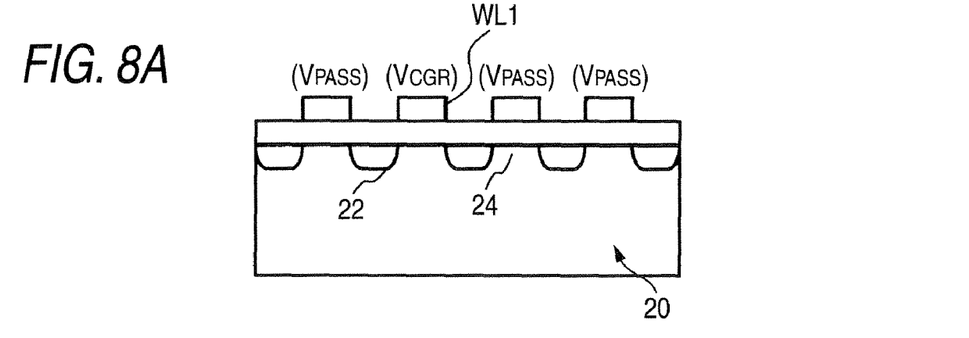
FIGS. 8A, 8B, and 8C are explanatory diagrams showing a reading operation on the nonvolatile semiconductor memory.
Figure 8B:
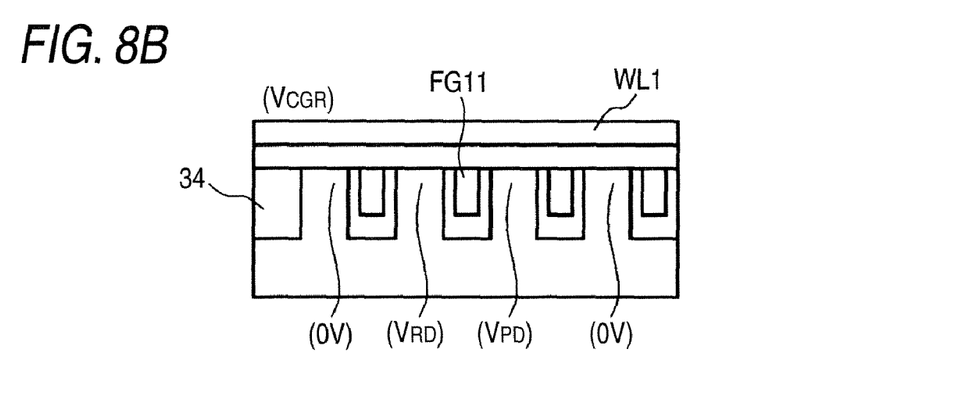
Figure 8C:
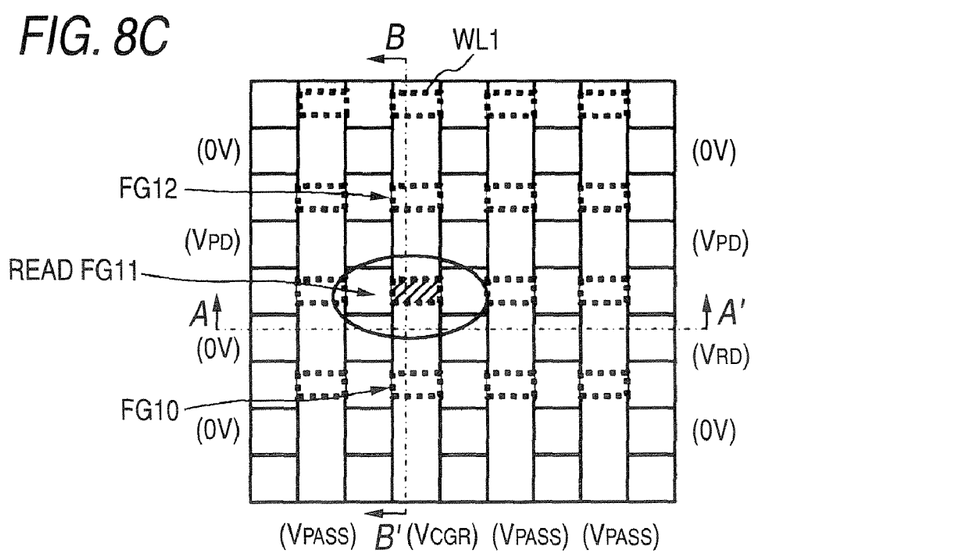

FIG. 8 shows voltage conditions that are employed in reading from a memory cell 38. A floating gate electrode 30 on which reading is to be performed is selected by selecting an associated word line WL and bit lines BL. Where a floating gate electrode 30 on which reading is to be performed is the floating gate electrode FG11, 0 V and a read voltage $V_{RD}$ are applied to the source side and the drain side of the bit line BL1, respectively. And a read voltage $V_{PD}$ is applied to both of the source side and the drain side of the bit line BL2. Both of the source side and the drain side of each of the other bit lines BL0 and BL3 are given 0 V. A voltage $V_{CGR}$ is applied to the word line WL1, and a voltage $V_{PASS}$ is applied to the other word lines WL0, WL2, and WL3. In this manner, the memory cell 38 concerned is selected by the one word line WL1 and the two bit lines BL1 and BL2. For example, the voltages $V_{RD}$, $V_{PD}$, and $V_{CGR}$ are 5 V, 5 V, and 10 V, respectively. With the above voltage conditions, the state of the floating gate electrode FG11 can be detected as a variation in the current flowing through the bit line BL1. That is, whatever state the floating gate electrode FG10 is in, the channel regions 24 of the bit line BL1 can be rendered conductive by setting the voltages $V_{RD}$, $V_{ED}$, and $V_{CGR}$ sufficiently high.

Figure 9:
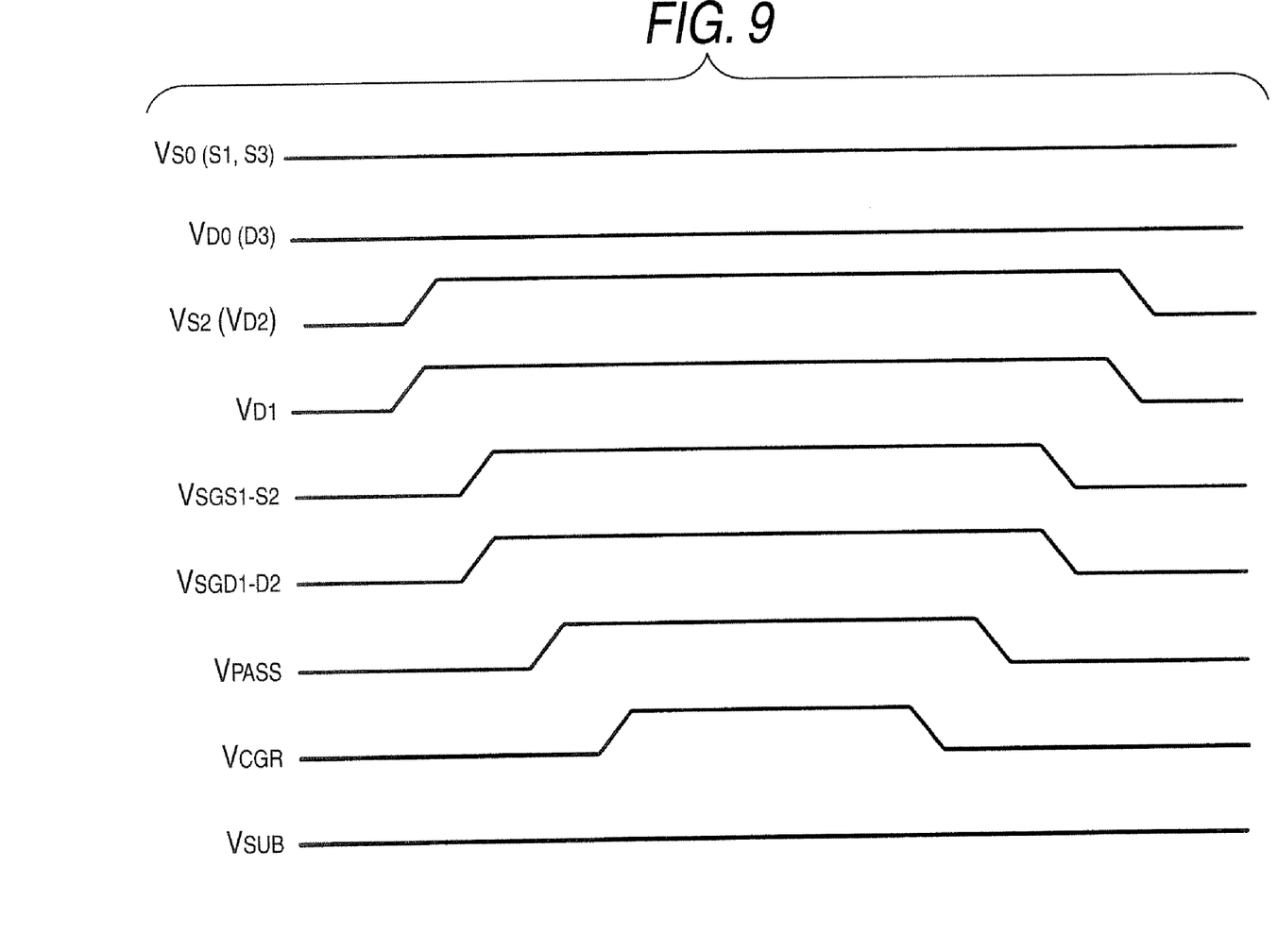
FIG. 9 is an explanatory diagram showing a voltage application sequence that is employed in reading.

FIG. 9 shows a voltage application sequence that is employed in reading from the floating gate electrode FG11. First, source voltages $V_{S0}$, $V_{S1}$, and $V_{S3}$ being 0 V are applied to the source sides of the bit lines BL0, BL1, and BL3 (i.e., they are grounded), and a source voltage $V_{S2}$ and a drain voltage $V_{D2}$ (both being equal to $V_{PP}$) are applied to the source side and the drain side of the bit line BL2. A drain voltage $V_{D1}$ being equal to $V_{RD}$ is applied to the drain side of the bit line BL1. Drain voltages $V_{D0}$ and $V_{D3}$ being 0 V are applied to the drain sides of the other bit lines BL0 and BL3 (i.e., they are grounded). Then, the source-side selection gates SGS1 and SGS2 are rendered conductive and the drain side selection gates SGD1 and SGD2 are also rendered conductive. As a result, the voltage $V_{PD}$ is applied to the source side and the drain side of the bit line BL2, that is, the voltage $V_{PD}$ is applied to the entire bit line BL2. The source side and the drain side of the bit line BL1 are given 0 V and the read voltage $V_{RD}$, respectively. Then, a voltage $V_{CGR}$ is applied to the word line WL1 and a voltage $V_{PASS}$ is applied to the other word lines WL0, WL2, and WL3. As a result, the read current flowing through the bit line BL1 is small if electrons are accumulated in the floating gate electrode FG11, and is large if electrons are not accumulated in the floating gate electrode FG11. The storage state of the floating gate electrode FG11 can be read by detecting such a difference in current. In this manner, the state of the floating gate electrode FG11 can be read irrespective of whether charge is accumulated in the floating gate electrodes FG10 and FG12 by applying the voltage $V_{PD}$ to the bit line BL2. That is, only whether charge is accumulated in the floating gate electrode FG11 can be detected by forming a channel in a semiconductor surface portion that is located on the side of the floating gate electrode FG11 by applying the voltage $V_{PD}$. This is the same mechanism as used for selecting a floating gate electrode FG in writing.

(Manufacturing Method of Memory Cells)

Figure 10A:
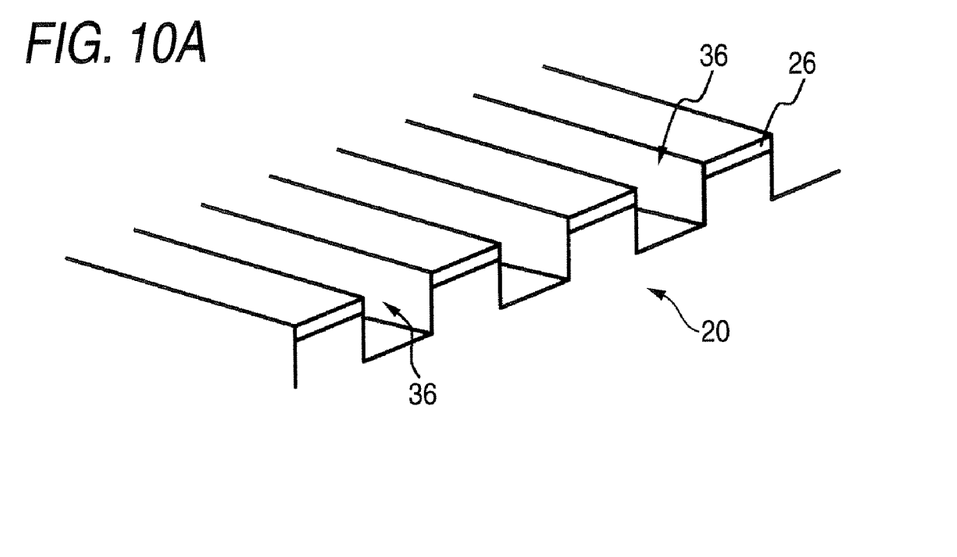
FIGS. 10A, 10B, and 10C are process diagrams of the first half of a manufacturing method of a nonvolatile semiconductor memory according to the first embodiment.
Figure 10B:
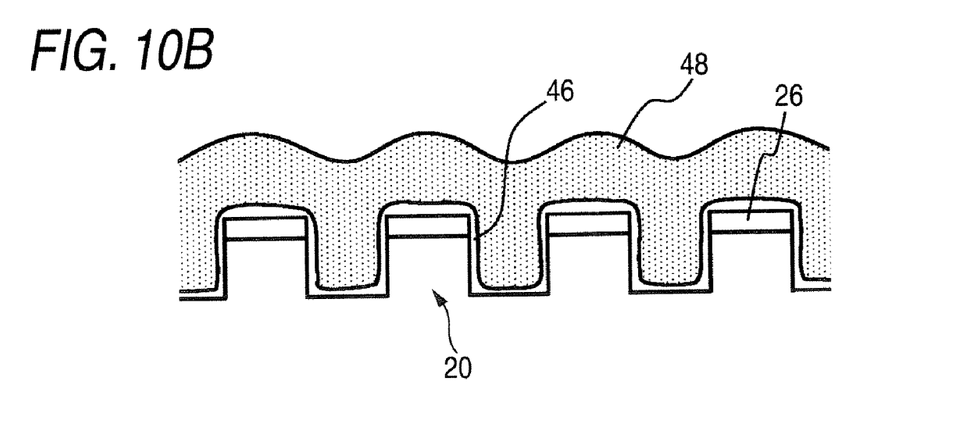
Figure 10C:
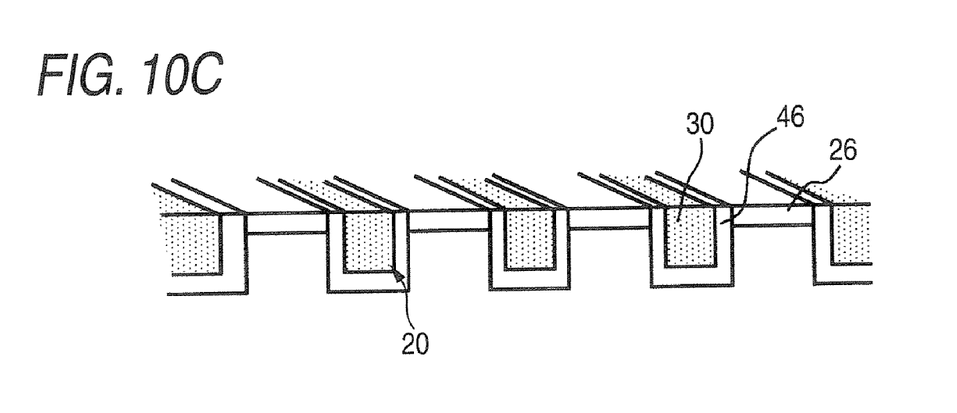

Techniques of known manufacturing methods of general semiconductor devices can be applied to a manufacturing method of a nonvolatile semiconductor memory according to the embodiment of the invention. FIGS. 10A, 10B, and 10C and FIGS. 11A, 11B, and 11C show an exemplary manufacturing method of memory cells 38. First, as shown in FIG. 10A, after a second insulating film 26 is formed on the surface of a semiconductor substrate 20 with SiN, SiON, a high-dielectric-constant material, or some other material, trenches 36 in which to dispose floating gate electrodes 30 are formed in the semiconductor substrate 20. Then, as shown in FIG. 10B, an insulating film 46 such as an oxide film is formed on the surface of the semiconductor substrate 20 including the surfaces of the trenches 36. Portions of the insulating film 46 will be used as first insulating films 32. In particular, the insulating film 46 is formed so as to be thin on the wall surfaces of the trenches 36 so that tunnel current will flow between the semiconductor substrate 20 and the floating gate electrodes 30 (to be formed later). Then, a conductive material layer 48 of n$^+$ polysilicon or the like is formed on the surface of the insulating film 46. Portions of the conductive material layer 48 will be used as the floating gate electrodes 30. Then, as shown in FIG. 10C, to planarize the surface of the semiconductor substrate 20, surface portions of the conductive material layer 48 and the insulating film 46 are removed by CMP, for example, until the second insulating film 26 is exposed.

Figure 11A:
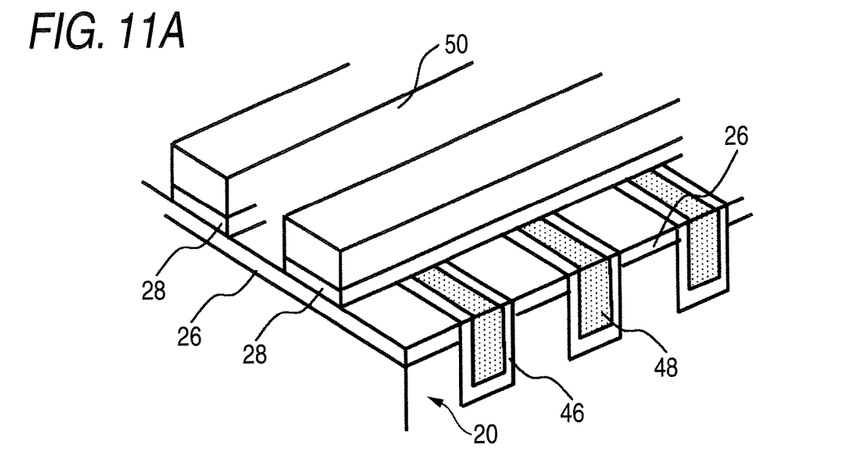
FIGS. 11A, 11B, and 11C are process diagrams of the second half of the manufacturing method of a nonvolatile semiconductor memory according to the first embodiment.
Figure 11B:
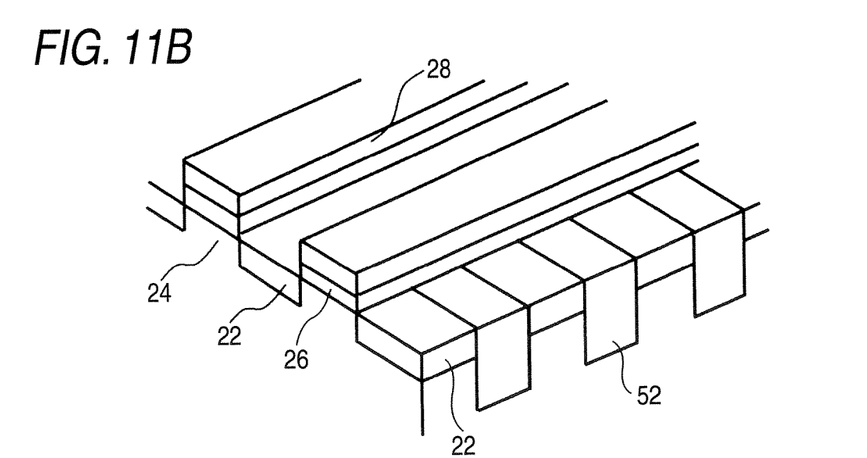
Figure 11C:
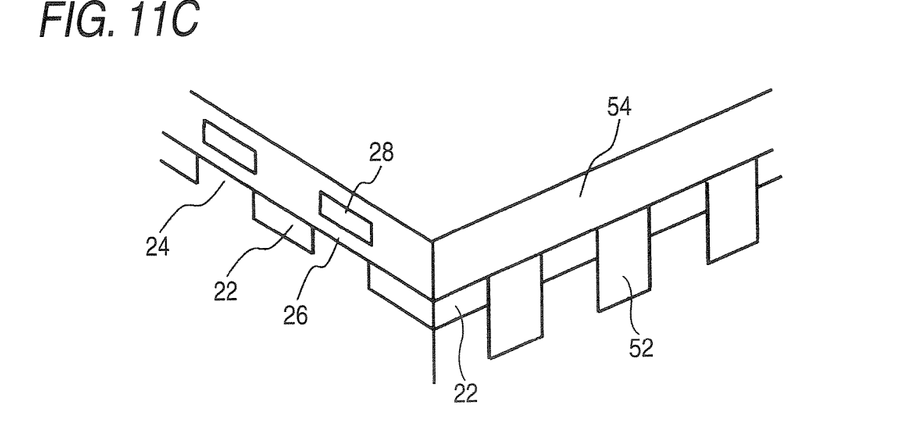

Subsequently, unnecessary portions of the conductive material layers 48 in the trenches 36 are removed and source/drain regions 22 are formed in surface portions of the semiconductor substrate 20. More specifically, this is done in the following manner. After a conductive material layer (to become control gate electrodes 28) of n+polysilicon or the like and photoresist layers 50 are formed sequentially on the surfaces of the second insulating films 26 and the conductive material layers 48, patterns of control gate electrodes 28 and photoresist layers 50 are formed as shown in FIG. 11A. Unnecessary portions of the conductive material layers 48 in the trenches 36 are removed by selective etching or a like method by using these two-layer patterns as a mask, and resulting holes are filled with buried insulating films 52 such as oxide films. Then, as shown in FIG. 11B, the photoresist layers 50 as the top layers of the two-layer patterns are removed and then those portions of the second insulating films 26 which are located on source/drain regions 22 (to be formed later) are removed. Source/drain regions 22 are formed by an impurity implantation method such as ion implantation by using the above-obtained patterns as a mask. Then, as shown in FIG. 11C, the surface of the semiconductor substrate 20 is covered with a coat layer 54 such as an oxide film. As mentioned above, this nonvolatile semiconductor memory can be manufactured by using various known techniques of semiconductor manufacturing methods. Since as described above the floating gate electrodes 30 are formed in the trenches 36 of the semiconductor substrate 20, the mask patterns that are used in forming the source/drain regions 22 can be made thinner than the aminated gate regions (including the floating gate electrodes) formed on the channel regions. This makes it possible to implant a large amount of impurity into the source/drain regions 22. As a result, a large current is allowed to flow between the source/drain regions 22, whereby the probability of occurrence of erroneous detection operations can be reduced in the nonvolatile semiconductor memory. Although in the above manufacturing method the first insulating films 32, the second insulating films 26, and the control gate electrodes 28 are formed by the particular manufacturing processes, they may be formed by other various manufacturing processes.

Second Embodiment

Figure 12A:
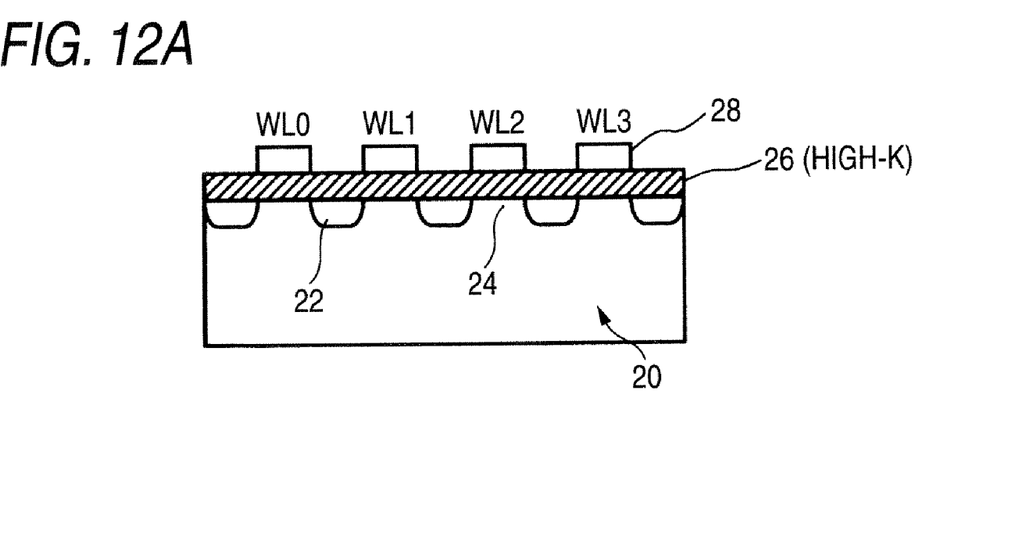
FIGS. 12A, 12B are explanatory diagrams of a nonvolatile semiconductor memory according to a second embodiment.
Figure 12B:
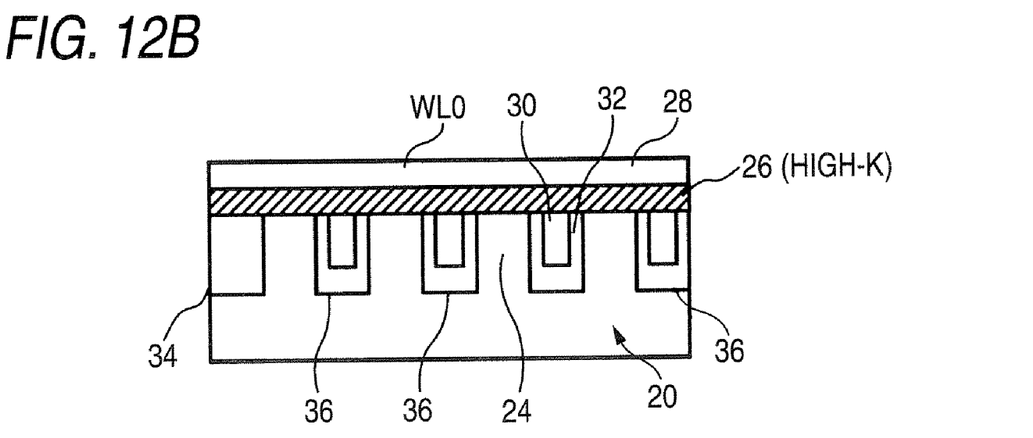

FIGS. 12A, 12B show a second embodiment. Trenches 36 are formed in surface portions of a semiconductor substrate 20 and floating gate electrodes 30 are formed in the trenches 36 via first insulating films 32. Control gate electrodes 28 are formed on portions of the surface of the semiconductor substrate 20 and the surfaces of the things filling the trenches 36 in such a manner that a second insulating film 26 that is a high-k film having higher permittivity than the first insulating films 32 is interposed in between. Providing the second insulating film 26 that is higher in permittivity than the first insulating films 32 allows the control gate electrodes 28 to maintain high electrical controllability on the channel regions 24 even if the channel regions 24 are made narrow.

Third Embodiment

Figure 13A:
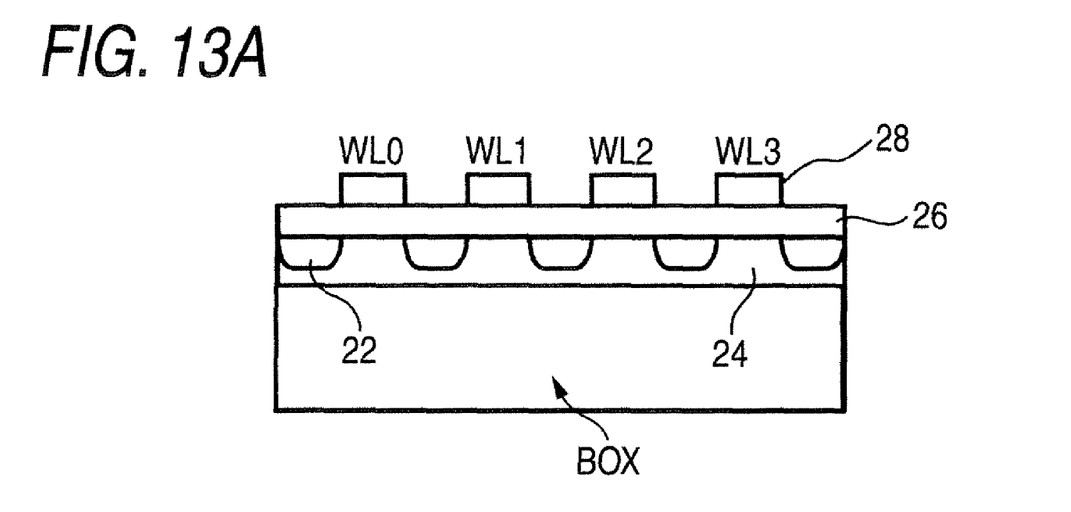
FIGS. 13A, 13B are explanatory diagrams of a nonvolatile semiconductor memory according to a third embodiment.
Figure 13B:
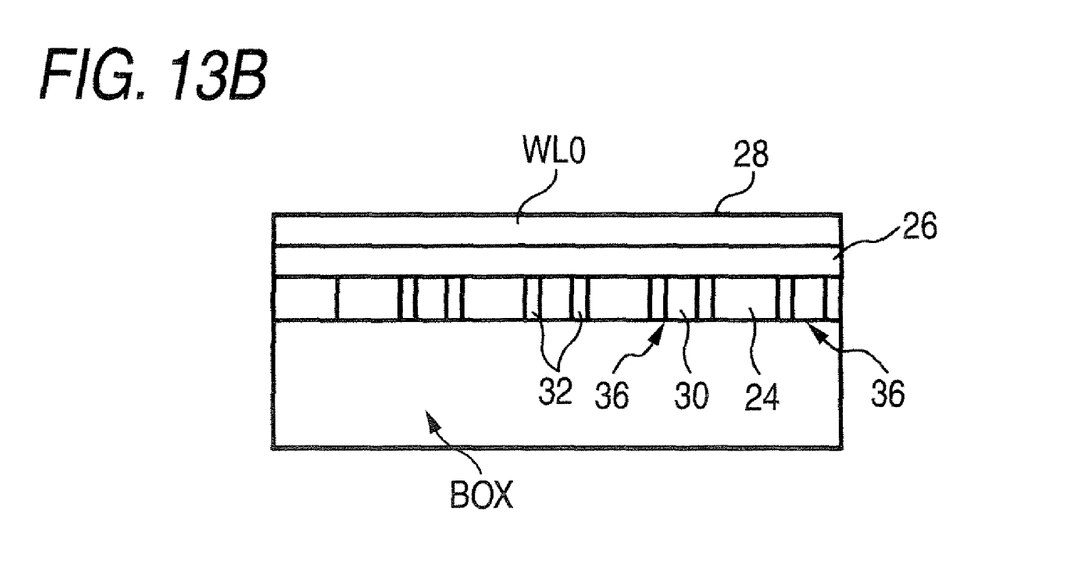

FIGS. 13A and 13B show a third embodiment. Plural trenches 36 are formed in surface portions of a semiconductor substrate 20 having a buried insulating film region BOX and floating gate electrodes 30 are formed in the trenches 36 via first insulating films 32. Control gate electrodes 28 are formed on portions of the surface of the semiconductor substrate 20 and the surfaces of the things filling the trenches 36. Providing the semiconductor substrate 20 with the buried insulating film region BOX allows the control gate electrodes 28 and the floating gate electrodes 30 to maintain high electrical controllability on the channel regions 24 even if the channel regions 24 are shortened by decreasing the interval between the source/drain regions 22, because it suppresses what is called the short channel effect.

Fourth Embodiment

Figure 14A:
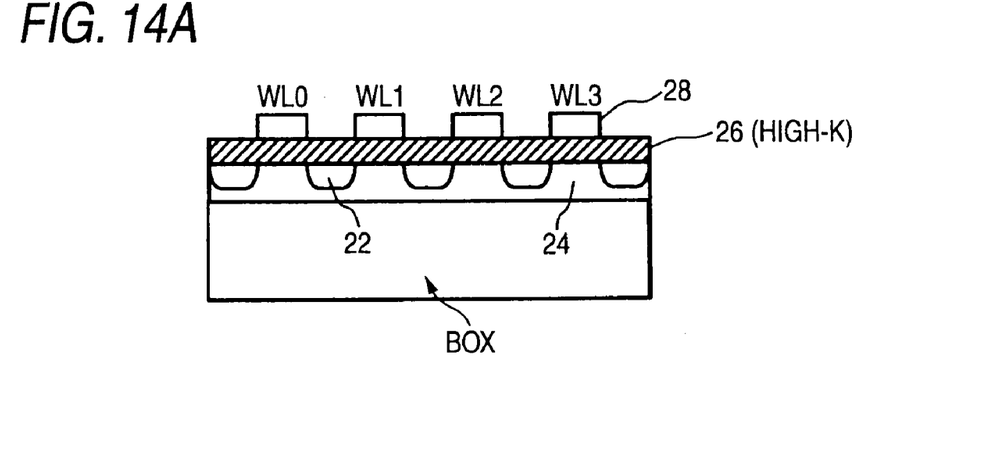
FIGS. 14A, 14B are explanatory diagrams of a nonvolatile semiconductor memory according to a fourth embodiment.
Figure 14B:
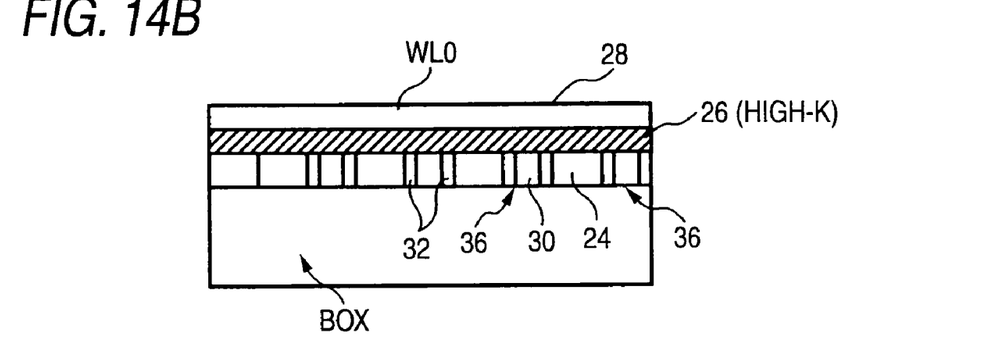

FIGS. 14A and 14B show a fourth embodiment, which is a combination of the second and third embodiment. Plural trenches 36 are formed in surface portions of a semiconductor substrate 20 having a buried insulating film region BOX and floating gate electrodes 30 are formed in the trenches 36 via first insulating films 32. Control gate electrodes 28 are formed on portions of the surface of the semiconductor substrate 20 and the surfaces of the things filling the trenches 36 in such a manner that a second insulating film 26 that is a high-k film having higher permittivity than the first insulating films 32 is interposed in between. Since the second insulating film 26 that is higher in permittivity than the first insulating films 32 is provided and the semiconductor substrate 20 is provided with the buried insulating film region BOX, the electrical controllability of the control gate electrodes 28 on the channel regions 24 can be kept high even if the channel regions 24 are made narrow. Further, the electrical controllability of the control gate electrodes 28 and the floating gate electrodes 30 on the channel regions 24 can be kept high even if the channel regions 24 are shortened by decreasing the interval between the source/drain regions 22, because what is called the short channel effect is suppressed.

The invention is not limited to the above embodiments, and the components can be modified in various manners without departing from the spirit and scope of the invention.

What is claimed is:

1. A nonvolatile semiconductor memory comprising:
    a semiconductor substrate;
    a plurality of semiconductor devices being formed on the semiconductor substrate; and
    a trench formed in the semiconductor substrate to divide adjacent semiconductor devices,
    wherein each of the semiconductor devices comprises:
        a first insulating film being formed on a wall surface and a bottom surface of the trench;
        a floating gate electrode formed on the first insulating film inside the trench;
        a source/drain region formed in the semiconductor substrate;
        a channel region formed in the semiconductor substrate on the wall surface of the trench;
        a second insulating film formed on a surface of the semiconductor substrate; and
        a control gate electrode formed on a surface of the second insulating film and above the channel region and the floating gate electrode, and
    wherein a storage state of each of the semiconductor devices is formed by injecting or drawing charge into or from the floating gate electrode when a tunnel current flows through the first insulating film,
    wherein a plurality of memory cells are formed on the semiconductor substrate in matrix form,
    wherein each memory cell is formed by a pair of the source/drain regions, the channel region, the floating gate electrode, and the control gate electrode,
    wherein the source/drain regions and the channel region of each memory cell form a row selection line,
    wherein the control gate electrode of each memory cell forms a column selection line, and
    the channel region being located at a junction of the row selection line and the column selection line between a pair of the source/drain regions in a first horizontal direction corresponding to the row selection line and between a pair of floating gate electrodes in a second horizontal direction corresponding to the column selection line.

2. The nonvolatile semiconductor memory according to claim 1, wherein the source/drain regions of adjacent memory cells is mutually used in the adjacent memory cells, so that a NAND memory is formed.

3. The nonvolatile semiconductor memory according to claim 1, wherein a memory cell of the plurality of memory cells is selected by adjacent row selection lines and a column selection line.

4. The nonvolatile semiconductor memory according to claim 3, wherein information is written to the selected memory cell by giving a potential difference between the adjacent row selection lines and giving a potential difference between the column selection line and the semiconductor substrate.

5. The nonvolatile semiconductor memory according to claim 3, wherein information stored in the selected memory cell is erased by giving a potential difference between the column selection line and the semiconductor substrate.

6. The nonvolatile semiconductor memory according to claim 3, wherein a potential is given to each adjacent row selection line,
    wherein a potential is given to the column selection line, and
    wherein a storage state of the selected memory cell is read out by a current flowing through the adjacent row selection line to which the potential is given.

7. The nonvolatile semiconductor memory according to claim 1, wherein the second insulating film is higher in permittivity than the first insulating film.

8. The nonvolatile semiconductor memory according to claim 1, wherein an insulating region is formed in a region under a memory cell of the semiconductor substrate.

9. The nonvolatile semiconductor memory according to claim 1, wherein the second insulating film is higher in permittivity than the first insulating film, and
    wherein an insulating region is formed in a region under a memory cell of the semiconductor substrate.

10. The nonvolatile semiconductor memory according to claim 1, wherein the control gate electrode and the second insulating film are disposed completely above an upper surface of the semiconductor substrate.

11. The nonvolatile semiconductor memory according to claim 1, wherein neither the control gate electrode nor the second insulating film fill in the trench.

* * * * *